United States Patent
Amidi et al.

(10) Patent No.: US 9,354,872 B2
(45) Date of Patent: May 31, 2016

(54) APPARATUS, SYSTEM, AND METHOD FOR NON-VOLATILE DATA STORAGE AND RETRIEVAL

(71) Applicant: Xitore, Inc., Laguna Niguel, CA (US)

(72) Inventors: Mike Hossein Amidi, Lake Forest, CA (US); Hossein Hashemi, Laguna Niguel, CA (US)

(73) Assignee: XITORE, INC., Mission Viejo, CA (US)

( * ) Notice: Subject to any disclaimer, the term of this patent is extended or adjusted under 35 U.S.C. 154(b) by 55 days.

(21) Appl. No.: 14/559,776

(22) Filed: Dec. 3, 2014

(65) Prior Publication Data

US 2015/0309742 A1  Oct. 29, 2015

Related U.S. Application Data

(60) Provisional application No. 61/983,944, filed on Apr. 24, 2014.

(51) Int. Cl.
| | | |
|---|---|---|
| *G06F 9/30* | (2006.01) | |
| *G06F 12/06* | (2006.01) | |
| *G06F 12/02* | (2006.01) | |
| *G06F 3/06* | (2006.01) | |
| *G06F 11/10* | (2006.01) | |
| *G11C 8/06* | (2006.01) | |
| *G11C 29/04* | (2006.01) | |

(52) U.S. Cl.
CPC .............. *G06F 9/30* (2013.01); *G06F 3/0619* (2013.01); *G06F 3/0635* (2013.01); *G06F 3/0655* (2013.01); *G06F 3/0679* (2013.01); *G06F 11/10* (2013.01); *G06F 12/0223* (2013.01); *G06F 12/06* (2013.01); *G06F 12/0638* (2013.01); *G06F 2206/1014* (2013.01); *G11C 8/06* (2013.01); *G11C 2029/0411* (2013.01)

(58) Field of Classification Search
CPC ....... G06F 9/30; G06F 12/06; G06F 12/0223; G06F 12/0638
See application file for complete search history.

(56) References Cited

U.S. PATENT DOCUMENTS

| | | |
|---|---|---|
| 8,001,434 B1 | 8/2011 | Lee et al. |
| 8,301,833 B1 | 10/2012 | Chen et al. |
| 8,359,501 B1 | 1/2013 | Lee et al. |
| 8,516,185 B2 | 8/2013 | Lee et al. |
| 8,516,187 B2 | 8/2013 | Chen et al. |

(Continued)

*Primary Examiner* — Joseph D Torres
(74) *Attorney, Agent, or Firm* — Knobbe, Martens, Olson & Bear LLP

(57) ABSTRACT

A computer memory device and a method of storing data are provided. The computer memory device includes a parallel memory interface configured to be operatively coupled to a system memory controller, to receive data and commands including logical addresses from the system memory controller, and to transmit data to the system memory controller. The parallel memory interface is configured to respond to the commands from the storage device driver of a computer processing unit. The computer memory device further includes an address translation circuit configured to receive the logical addresses from the parallel memory interface and to translate the received logical addresses to corresponding physical addresses. The computer memory device further includes a non-volatile memory operatively coupled to the parallel memory interface and the address translation circuit. The non-volatile memory is configured to receive the physical addresses and the data and to store the data at memory locations of the non-volatile memory corresponding to the physical addresses.

28 Claims, 12 Drawing Sheets

(56) References Cited

U.S. PATENT DOCUMENTS

| | | | |
|---|---|---|---|
| 8,713,379 B2 | 4/2014 | Takefman et al. | |
| 2004/0266267 A1* | 12/2004 | Inaba | G06K 7/0013 439/630 |
| 2005/0033992 A1* | 2/2005 | Inabe | G06F 3/03543 726/19 |
| 2013/0042054 A1* | 2/2013 | Jung | G06F 12/0246 711/103 |
| 2013/0132639 A1 | 5/2013 | Amidi et al. | |
| 2013/0173875 A1* | 7/2013 | Kim | G06F 12/0246 711/160 |
| 2013/0173954 A1* | 7/2013 | Woo | G06F 11/167 714/6.13 |
| 2013/0185268 A1* | 7/2013 | Kim | H03M 7/3084 707/693 |
| 2014/0108747 A1* | 4/2014 | Seol | G06F 12/00 711/154 |
| 2014/0372679 A1* | 12/2014 | Flynn | G06F 1/183 711/103 |

\* cited by examiner

APPARATUS, SYSTEM, AND METHOD FOR NON-VOLATILE DATA STORAGE AND RETRIEVAL

CROSS-REFERENCE TO RELATED APPLICATIONS

This application claims the benefit of U.S. Provisional Appl. No. 61/983,944, filed on Apr. 24, 2014 and incorporated in its entirety by reference herein.

BACKGROUND

1. Field

The present application is generally related to computer memory, and more particularly, to apparatuses, systems, and methods for data storage and retrieval using non-volatile computer memory.

2. Description of the Related Art

Computer systems operate, in part, using volatile memory. Computer memory modules using random access memory (RAM) typically do not retain any data once the main power source is lost (e.g., turned off or experiencing a power failure). In contrast, non-volatile computer memory, such as read only memory (ROM), tends to have long-term storage capacity, but tends to be slower than RAM.

As systems become more complex and mission-critical, the possibility of irreplaceable data being stored in volatile memory increases. For this reason, the majority of mission-critical data can be periodically stored in non-volatile memory. Various options are available for such non-volatile storage units, including but not limited to hard drive devices (HDD), solid state drives (SSD), or solid state storage (SSS) units. Computer systems utilizing such non-volatile memory can transfer data from a host's in-line volatile memory module directly connected to a main processing unit to the non-volatile memory operationally connected to the computer system. For example, the host's central processing unit can fetch data blocks from volatile memory and can send them out to the downstream controllers. Once the target controller receives these data blocks, they can be stored in the non-volatile memory.

SUMMARY

In certain embodiments, a computer memory device is provided. The computer memory device is configured to be operatively coupled to a computer system comprising a computer processing unit having a storage device driver and a system memory controller operatively coupled to the computer processing unit. The computer memory device comprises a parallel memory interface configured to be operatively coupled to the system memory controller, to receive data and commands comprising logical addresses from the system memory controller, and to transmit data to the system memory controller. The parallel memory interface is configured to respond to the commands from the storage device driver of the computer processing unit. The computer memory device further comprises an address translation circuit configured to receive the logical addresses from the parallel memory interface and to translate the received logical addresses to corresponding physical addresses. The computer memory device further comprises a non-volatile memory operatively coupled to the parallel memory interface and the address translation circuit. The non-volatile memory is configured to receive the physical addresses and the data and to store the data at memory locations of the non-volatile memory corresponding to the physical addresses.

In certain embodiments, a method of storing data is provided. The method comprises receiving commands from a system memory controller of a computer system. The commands comprise logical addresses and are received by a computer memory device comprising a parallel memory interface operatively coupled to the system memory controller and operatively coupled to an non-volatile memory. The method further comprises responding to the commands by translating the received logical addresses to corresponding physical addresses of the non-volatile memory. The method further comprises receiving data from the system memory controller by the parallel memory interface. The method further comprises storing the data at memory locations of the non-volatile memory corresponding to the physical addresses.

DETAILED DESCRIPTION

Conventional data transfers among volatile memory and non-volatile memory can require several hardware, firmware, and driver interactions using multiple hardware and software levels within one or more units. The overall latencies associated with existing non-volatile storage include the time required to fetch data blocks from volatile memory into a host processing unit, transferring data blocks from the host processing unit to a host main memory controller, sending the data blocks from the host main memory controller to a targeted storage controller via one or more data bridges, and storing the data blocks from the target storage controller into non-volatile memory media.

Figure 1A:
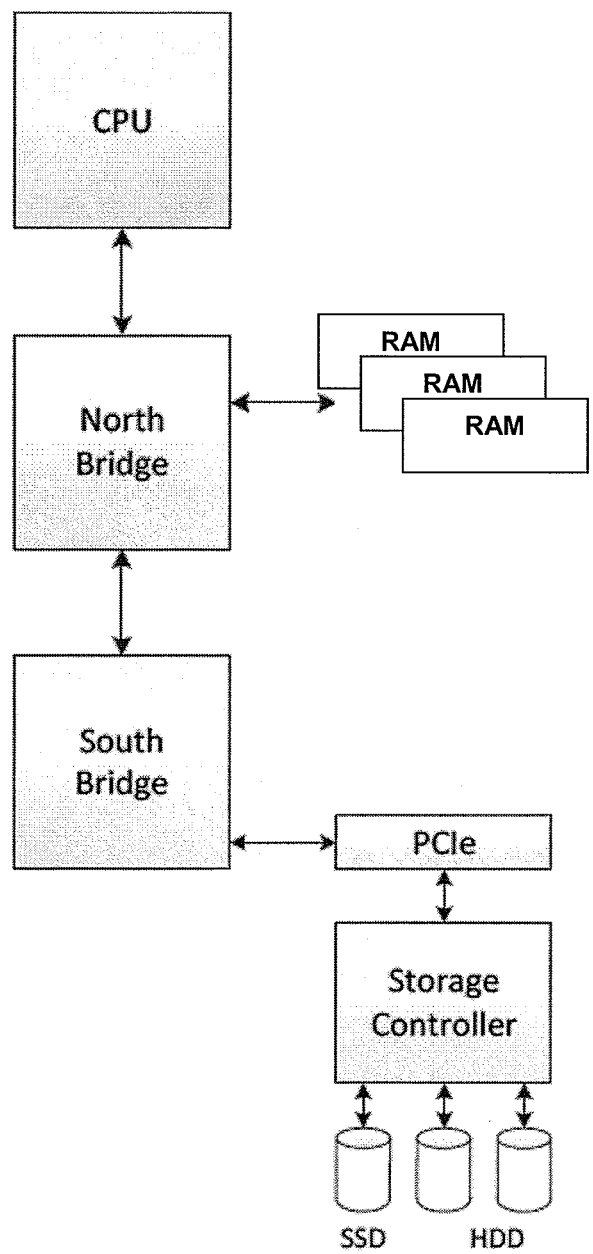
FIG. 1A schematically illustrates an example configuration of a conventional computer system including both volatile memory and non-volatile memory.

FIG. 1A schematically illustrates an example configuration of a conventional computer system including both volatile memory and non-volatile memory. A central processing unit (CPU) is operatively coupled to a north bridge (e.g., a host bridge, memory controller hub) circuit and to a south bridge (e.g., I/O controller hub) circuit. The north bridge circuit and the south bridge circuit can collectively be referred to as the chipset. The north bridge circuit is operatively coupled to volatile random access memory (RAM) (e.g., one or more volatile RAM modules in one or more DIMM slots) serving as the main memory of the computer system. The south bridge circuit is operatively coupled via one or more serial input/output bus interfaces (e.g., PCI express or PCIe bus) to a storage controller (e.g., serial ATA or SATA, serial attached SCSI or SAS, fiber channel or FC, etc.) which is operatively coupled to one or more non-volatile memory devices (e.g., solid state devices, hard drive devices, solid state storage devices, tape devices).

The CPU can comprise a host device driver that requests that a memory controller of the north bridge circuit read from or write to data sectors of the non-volatile memory devices. In this example, to execute READ commands to read data from the non-volatile memory devices, the following operations can occur:

The memory controller of the north bridge circuit sends data read requests to the south bridge circuit.

The south bridge circuit translates the data read requests to PCIe packets and sends the PCIe packets to the storage controller via the PCIe bus.

The storage controller translates the PCIe packets to READ storage commands and sends them to the appropriate non-volatile storage device.

The storage device interprets the READ storage commands, fetches the data, and responds back to the storage controller when the data being read is ready.

The storage controller reads and converts the data to PCIe packets and sends the PCIe packets to the south bridge circuit. The status is also appended to the end of the READ data.

The PCIe bus translates the PCIe packets back to raw data and sends the data via the south bridge circuit to the memory controller of the north bridge circuit.

The memory controller places the data into volatile RAM.

The host device driver examines the status of the command at the end of the READ data and informs the CPU that the data is ready.

In this example, to execute WRITE commands to write data to the non-volatile memory devices, the following operations can occur:

The memory controller of the north bridge circuit sends data write requests to the south bridge circuit.

The south bridge circuit translates the data write requests to PCIe packets and sends the PCIe packets to the storage controller via the PCIe bus.

The storage controller translates the PCIe packets to WRITE storage commands and sends them to the appropriate non-volatile storage device.

The storage device interprets the WRITE storage commands, and responds back to the storage controller when it is ready to accept the data to be written. (Some storage devices accept limited WRITE data with the WRITE storage commands).

The memory controller of the north bridge circuit transfers the data to be written from volatile RAM to the south bridge circuit.

The south bridge circuit translates the data to be written to PCIe packets and sends the PCIe packets to the storage controller via the PCIe bus.

The storage controller translates the PCIe packets to storage format and sends them to the appropriate non-volatile storage device.

The non-volatile storage device saves the data and responds back to the storage controller reporting the status that the data has been stored.

The storage controller transfers the status to the north bridge circuit via PCIe packets and the south bridge circuit.

The host device driver informs the CPU that the data has been stored.

As a result of the multiple intervening elements and steps between the north bridge circuit and the non-volatile memory of this multi-drop configuration, the overall latencies and bandwidth can be adversely affected.

Figure 1B:
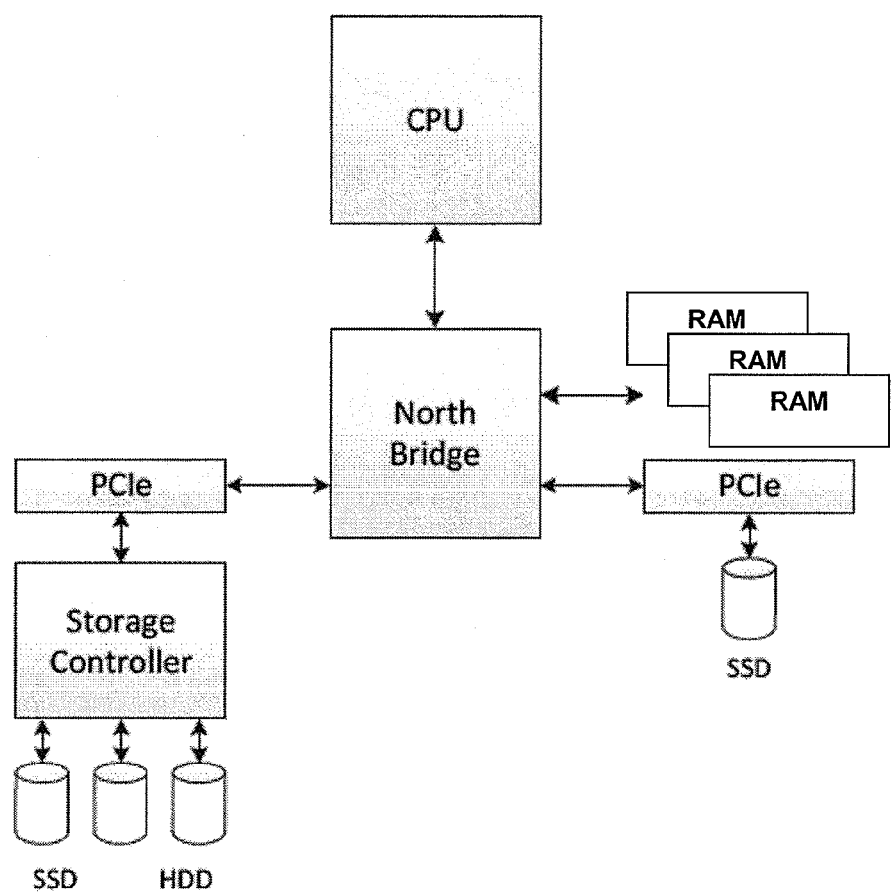
FIG. 1B schematically illustrates another example configuration of a conventional computer system including both volatile memory and non-volatile memory.

FIG. 1B schematically illustrates another example configuration of a conventional computer system including both volatile memory and non-volatile memory. In FIG. 1B, the south bridge circuit is eliminated from the CPU chipset. The north bridge circuit is operatively coupled to the volatile RAM and via the one or more serial input/output bus interfaces (e.g., PCIe bus) to a storage controller operatively coupled to one or more non-volatile memory devices. By eliminating the south bridge circuit, such configurations can reduce the number of steps for reading or writing data. For high-performance solid state devices, the storage controller can also be eliminated, as shown in the right-hand side of FIG. 1B. However, although the storage controller may have been eliminated by using the high-performance solid state device, the high-performance solid state device still has to perform translations between raw data and the serial PCIe packets to be able to read and write data.

Figure 1C:
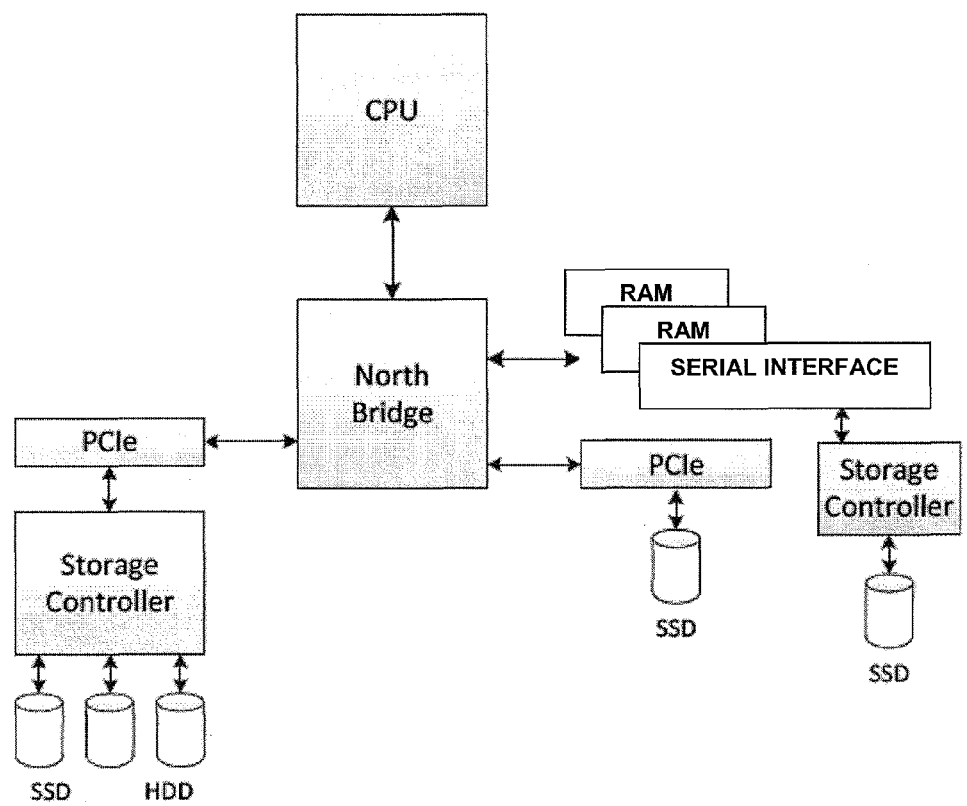
FIG. 1C schematically illustrates still another example configuration of a conventional computer system including both volatile memory and non-volatile memory.

FIG. 1C schematically illustrates still another example configuration of a conventional computer system including both volatile memory and non-volatile memory. In FIG. 1C, instead of being coupled to a volatile RAM module, a DIMM slot is operatively coupled to a serial interface which is operatively coupled to a corresponding non-volatile memory device (e.g., SSD) via a corresponding storage controller. The serial interface is used to transfer data and to convert raw data to or from the storage controller protocol (e.g., SATA). An example of such a configuration is described by U.S. Pat. No. 8,713,379.

Figure 2:
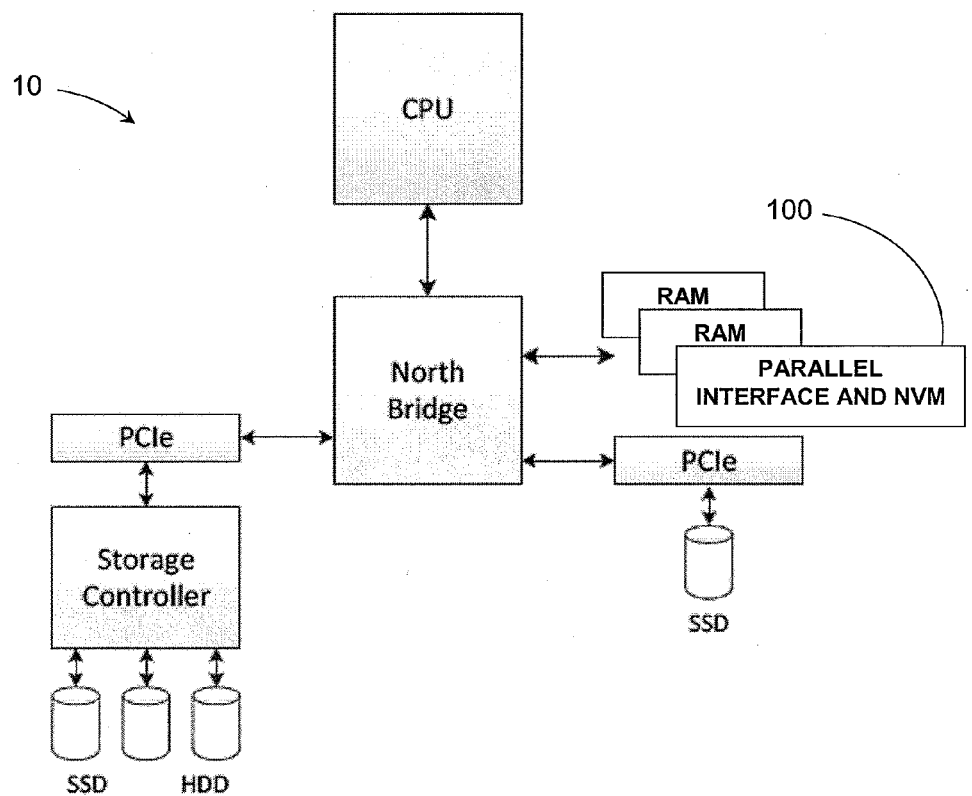
FIG. 2 schematically illustrates an example computer system operatively coupled to an example computer memory device in accordance with certain embodiments described herein.

FIG. 2 schematically illustrates an example computer system 10 operatively coupled to an example computer memory device 100 in accordance with certain embodiments described herein. The computer memory device 100 can be operatively coupled to a DIMM slot of the computer system 10, thereby advantageously moving the non-volatile memory significantly closer to the CPU than in conventional configurations. By operatively coupling the computer memory device 100 to the DIMM slot, the computer memory device 100 of certain embodiments can advantageously be placed among the volatile RAM modules of the main memory and can operate at the speed of the volatile RAM modules. The computer memory device 100 of certain embodiments advantageously does not require translation of data between various parts of the computer system 10, so data can flow between the volatile RAM modules of the main memory and the non-volatile memory of the computer memory device 100 without the intervention of host processing units. By not using a storage controller as done in conventional systems, certain embodiments described herein can advantageously use data in parallel format to be stored in the non-volatile memory of the computer memory device 100. The computer memory device 100 of certain embodiments can advantageously drastically improve inner host system communication, data transfer rates, and available data bandwidth, while reducing latencies related to volatile to non-volatile data transfers.

Figure 3:
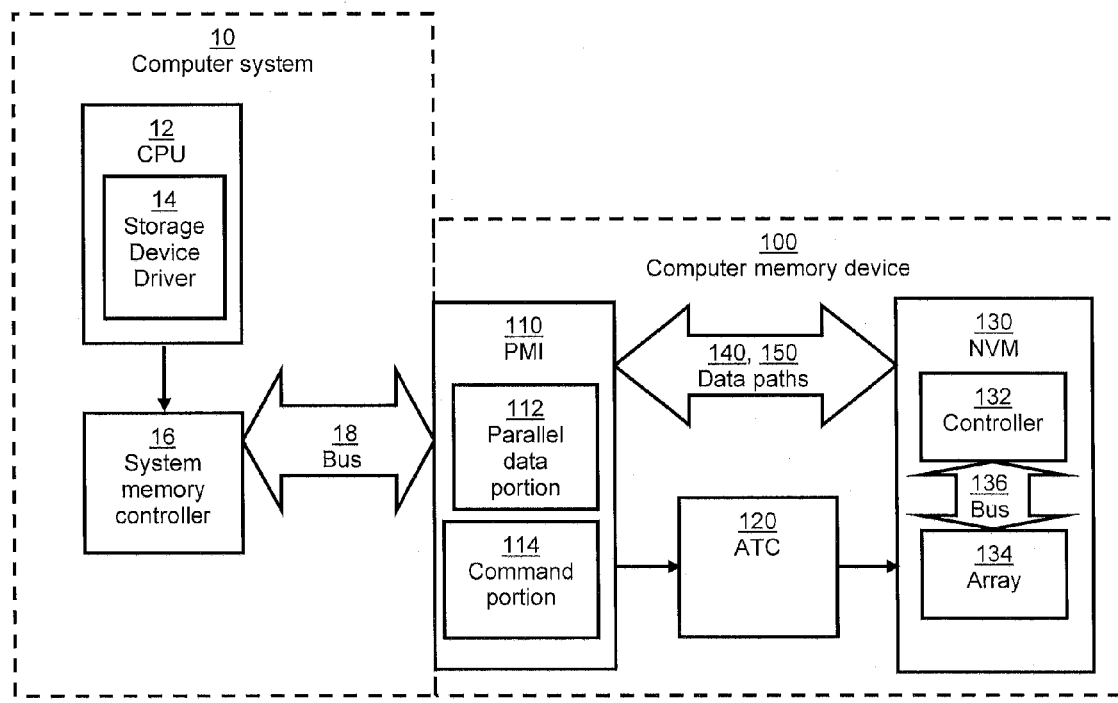
FIG. 3 schematically illustrates an example computer memory device in accordance with certain embodiments described herein.

FIG. 3 schematically illustrates an example computer memory device 100 in accordance with certain embodiments described herein. The computer memory device 100 is configured to be operatively coupled to a computer system 10 comprising a computer processing unit (CPU) 12 having a storage device driver 14 and a system memory controller 16 operatively coupled to the CPU 12. The computer memory device 100 comprises a parallel memory interface (PMI) 110 configured to be operatively coupled to the system memory controller 16, to receive data and commands comprising logical addresses from the system memory controller 16, and to transmit data to the system memory controller 16. The PMI 110 is configured to respond to the commands from the storage device driver 14 of the CPU 12. The computer memory device 100 further comprises an address translation circuit (ATC) 120 configured to receive the logical addresses from the PMI 110 and to translate the received logical addresses to corresponding physical addresses. The computer memory device 100 further comprises a non-volatile memory (NVM) 130 operatively coupled to the PMI 110 and the ATC 120. The NVM 130 is configured to receive the physical addresses and the data and to store the data at memory locations of the NVM 130 corresponding to the physical addresses.

In certain embodiments, the computer system 10 can comprise a host computer, examples of which include but are not limited to: a server (e.g., blade server, 1U server, database server, web server, gaming server, application server), personal computer (PC), data storage system. The CPU 12, the storage device driver 14, and the system memory controller 16 can be mounted on a system board of the host computer. The computer system 10 can further comprise a host system memory controller bus 18 operatively coupled to at least one host main memory interface, such as one or more host main memory module slots (e.g., one or more standard dual in-line memory module (DIMM) slots). The computer system 10 can further comprise one or more volatile RAM modules (not shown) operatively coupled to the one or more memory module slots. As described more fully below, at least one of the one or more memory module slots can be operatively coupled to the computer memory device 100 in accordance with certain embodiments described herein.

In certain embodiments, two or more of the CPU 12, the storage device driver 14, and the system memory controller 16 can be manifested, in whole or in part, in the same integrated circuit. For example, the storage device driver 14 can comprise a portion of the circuitry of the CPU 12 and/or can be a software module programmed into the CPU 12 and which resides in the memory of the CPU 12 of the host computer. The storage device driver 14 can be a dedicated hardware driver or software driver of the CPU 12 that communicates with the computer memory device 100 and that translates transactions from the CPU 12 for communication to the computer memory device 100. The system memory controller 16 can be a portion of a north bridge circuit that is operatively coupled to the CPU 12. The system memory controller 16 can be operatively coupled to the host system memory controller bus 18 and, via the memory controller bus 18, to a host main memory interface (e.g., a DIMM slot) that is configured to be operatively coupled to the computer memory device 100.

The PMI 110 of certain embodiments is configured to be operatively coupled to the host system memory controller bus 18. For example, the PMI 110 can be configured to be operatively coupled to a host main memory interface (e.g., a DIMM slot) that is operatively coupled to the memory controller bus 18, can receive data from the system memory controller 16, and can receive commands comprising logical addresses from the storage device driver 14 via the host main memory interface. The PMI 110 of certain embodiments can comprise a unidirectional interface which can be characterized as "dumb" in that the PMI 110 is configured to receive commands from the storage device driver 14 but can only transmit data, not other signals, to the storage device driver 14. The PMI 110 of certain such embodiments can present information (e.g., status) in a manner that can be read by the storage device driver 14, as described more fully below.

The PMI 110 can comprise a parallel data portion 112 configured to receive data in parallel from the computer system 10 and to transmit data in parallel to the computer system 10. The PMI 110 can further comprise a command portion 114 configured to receive commands from the computer system 10, the commands comprising logical addresses. The command portion 114 can comprise at least one command queue that is configured to store the commands received by the command portion 114 of the PMI 110 and at least one command status circuit that is configured to present status information regarding the commands in the at least one command queue in a manner that is accessible to the computer system 10. As described herein, the command portion 114 can be configured to receive a series of commands from the system memory controller 16 in a first order, and the computer memory device 100 (e.g., the at least one command queue) can be configured to execute the commands in a second order different from the first order (e.g., the second order can be based on relative priorities of the commands rather than the order in which the commands were received). Thus, the computer memory device 100 can be configured to execute a series of out-of-order commands on the at least one command queue (e.g., to improve internal bus utilization). Furthermore, the PMI 110 is configured to respond to commands from the storage device driver 14 of the CPU 12, as described herein.

The ATC 120 of certain embodiments is configured to receive logical addresses extracted from the commands received by the command portion 114 of the PMI 110 and to translate the received logical addresses to corresponding physical addresses corresponding to physical locations within the NVM 130 at which data received from the computer system 10 is to be stored within the NVM 130 and to physical locations within the NVM 130 at which data requested by the computer system 10 was previously stored within the NVM 130. As described more fully below in the various examples, in certain embodiments, the computer memory device 100 comprises volatile memory, and the ATC 120 is further configured to translate the received logical addresses to corresponding internal volatile memory addresses corresponding to physical locations within the volatile memory at which data received from the computer system 10 is to be stored within the volatile memory and to physical locations within the volatile memory at which data requested by the computer system 10 was previously stored within the volatile memory. In certain embodiments, the ATC 120 comprises an internal address cache which can be implemented using one of the following schemes: least recently used (LRU), least frequently used (LFU), most recently used (MRU), and the internal address cache can be utilize one or multiple way set associative architecture, in either write-through, write-back, read-through, or read-back policies.

In addition to translating host logical addresses to non-volatile memory physical addresses (and possibly to internal volatile memory addresses), in certain embodiments, the ATC 120 can be further configured to provide indications of the validity of data within the non-volatile memory physical addresses (and/or the internal volatile memory addresses). For example, for a computer memory device 100 comprising volatile memory, upon decoding a command received from the computer system 10, a logical address is transmitted to the ATC 120, and the ATC 120 can check the validity of the data either in the corresponding internal volatile memory address or the corresponding non-volatile memory physical address. For example, the ATC 120 can comprise dedicated validity flags for memory entries per each logical address for the non-volatile memory, for the volatile memory, or for both. Write data can be transferred to the internal volatile memory location identified by the ATC 120. Read data can be fetched from the internal volatile memory location if valid, or from the non-volatile memory physical location and placed in the internal volatile memory prior to transfer to the computer system 10. In certain embodiments, the ATC 120 can be configured to generate physical addresses that correspond to the logical addresses to reflect data transfers that are performed due to non-volatile memory management (e.g., avoidance of bad blocks).

The NVM 130 of certain embodiments is operatively coupled to the PMI 110 to receive data (e.g., via a write data path 140) that had been received by the PMI 110 from the computer system 100 (e.g., from the memory controller bus 18) and to provide data (e.g., via a read data path 150) to the PMI 110 that had been requested by the computer system 100. The NVM 130 of certain embodiments is also operatively coupled to the ATC 120 and configured to receive the physical addresses that correspond to the physical locations within the NVM 130 at which the data received from the PMI 110 is to be stored within the NVM 130 and the physical locations within the NVM 130 at which the data to be provided to the PMI 110 was previously stored within the NVM 130. Examples of NVM 130 that are compatible with certain embodiments described herein include, but are not limited to, hard drive devices (HDD), solid state drives (SSD), or solid state storage (SSS) units. In certain embodiments, the NVM 130 comprises a controller 132 (e.g., a non-volatile memory interface) and an array 134 of non-volatile memory locations operatively coupled to the controller 132 (e.g., via a parallel data bus 136 comprising a plurality of channels). The controller 132 can emulate a redundant array of independent disk (RAID) configuration. For example, the controller 132 of the NVM 130 can support one or more dedicated channels to non-volatile storage elements of the array 134.

In certain embodiments, the computer memory device 100 is controlled by the storage device driver 14 which can reside in the host CPU 12. For example, the PMI 110, the ATC 120, and the NVM 130 can be responsive to control signals from the storage device driver 14 to store data in the NVM 130 and to retrieve data that had been previously stored in the NVM 130. In this way, certain embodiments described herein can use minimal host CPU time to communicate (e.g., read and write data) between the computer memory device 100 and the computer system 10. In certain embodiments, the computer memory device 100 comprises one or more processors which receive control signals from the storage device driver 14 and which transmit corresponding control signals to the PMI 110, the ATC 120, the NVM 130, and other components of the computer memory device 100 to store and retrieve data using the NVM 130 while using minimal host CPU time to communicate (e.g., read and write data) between the computer memory device 100 and the computer system 10.

Figure 4A:
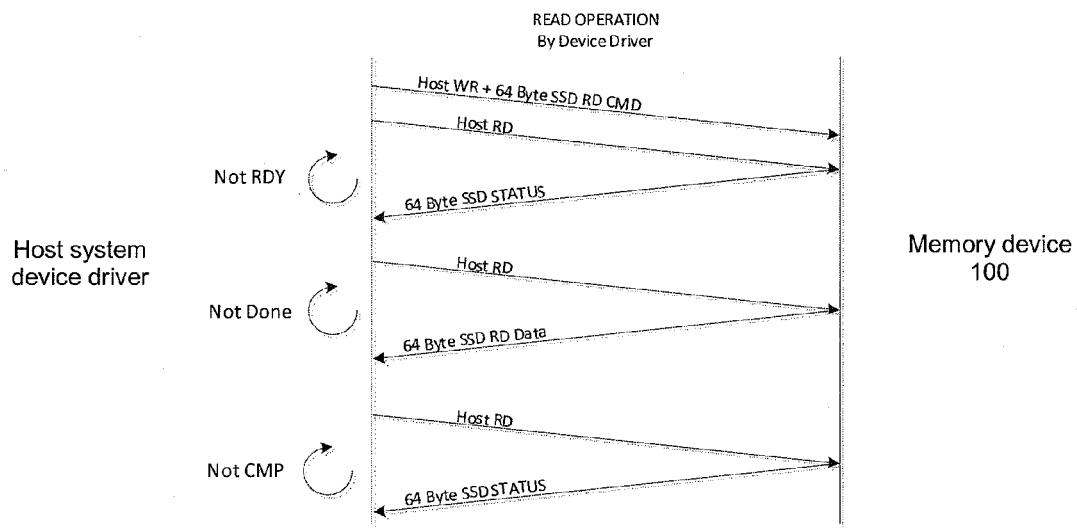
FIGS. 4A and 4B schematically illustrate an example read operation and an example write operation, respectively, controlled by the storage device driver of the host CPU in accordance with certain embodiments described herein.
Figure 4B:
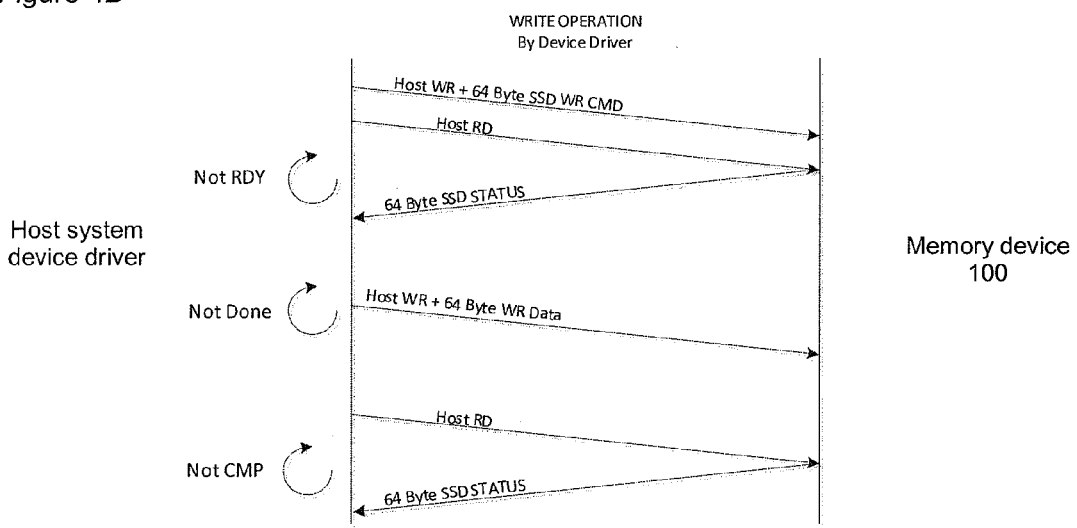
Figure 4C:
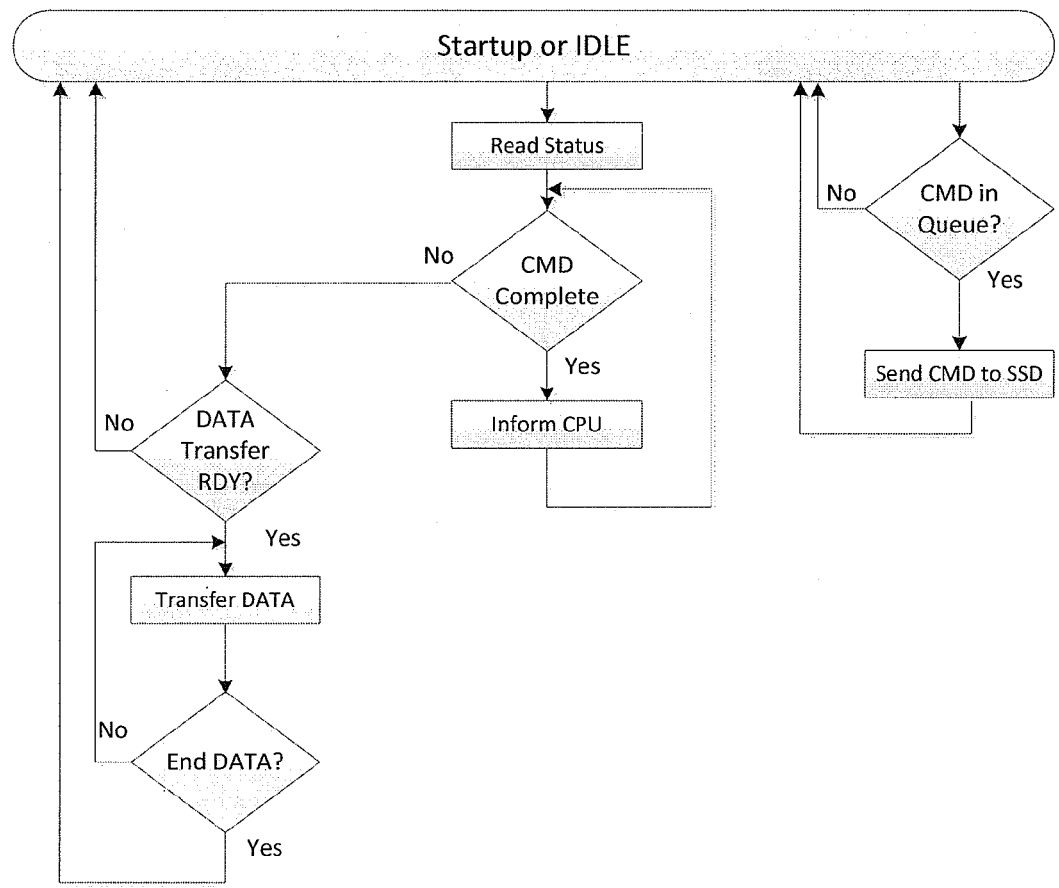
FIG. 4C is a flow diagram corresponding to the example read and write operations of FIGS. 4A and 4B.

FIGS. 4A and 4B schematically illustrate an example read operation and an example write operation, respectively, controlled by the storage device driver 14 of the host CPU 12 in accordance with certain embodiments described herein. FIG. 4C is a flow diagram corresponding to the example read and write operations of FIGS. 4A and 4B.

For the example read operation, the storage device driver 14 transmits a read command to the computer memory device 100. For example, a read command can be placed in a command queue of the PMI 110 to obtain data from a solid-state drive (SSD) of the NVM 130. The storage device driver 14 then repeatedly checks for the status of the read command (shown schematically in FIG. 4A by the "Not RDY" arrow) until the computer memory device 100 indicates that the status of the read command has changed to "data transfer ready." The host CPU 12 can then read the data from the computer memory device 100 (e.g., from the PMI 110) in as many data bursts as are needed to provide the data (shown schematically in FIG. 4A by the "Not Done" arrow), and the host CPU 12 can place the received data in the host main memory. The storage device driver 14 can then check the completion status of the read command (shown schematically in FIG. 4A by the "Not CMP" arrow), and once the computer memory device 100 indicates that the status of the read command is completed, the storage device driver 14 can inform the host CPU 12 that the read command has been completed.

For the example write operation, the storage device driver 14 transmits a write command to the computer memory device 100. For example, a write command can be placed in a command queue of the PMI 110 to store data in a solid-state drive (SSD) of the NVM 130. The storage device driver 14 then repeatedly checks for the status of the write command (shown schematically in FIG. 4B by the "Not RDY" arrow) until the computer memory device 100 indicates that the status of the write command has changed to "data transfer ready." The host CPU 12 can then write the data to the computer memory device 100 (e.g., provide the data to the PMI 110) in as many data bursts as are needed to provide the data (shown schematically in FIG. 4B by the "Not Done" arrow), and the computer memory device 100 can place the provided data in the NVM 130. The storage device driver 14 can then check the completion status of the write command (shown schematically in FIG. 4B by the "Not CMP" arrow), and once the computer memory device 100 indicates that the status of the write command is completed, the storage device driver 14 can inform the host CPU 12 that the write command has been completed.

In certain embodiments, the storage device driver 14 can transmit commands (e.g., read or write commands) to the computer memory device 100 at any time, and both the storage device driver 14 and the computer memory device 100 can have a copy of the command queue. For example, a master command queue can be in the storage device driver 14 and a slave copy of the command queue can be in the PMI 110, and the two command queues can be kept up-to-date by appropriate status reporting information being presented by the PMI 110 in a manner that is accessible to the storage device driver 14. The command queue can have a capacity limited to holding a predetermined number of active commands at any one time. Once a command has been completed, its position within the command queue can be replaced by another command (e.g., a new command or another command from within the command queue). The operation of replacing one command with another in the command queue can be an indication to the computer memory device 100 that the previous command has been completed in the host CPU 12.

In certain embodiments, each status read from the computer memory device 100 can include the statuses of some or all the commands in the command queue. For certain embodiments in which commands can be executed out of order (e.g., transmitted from the storage device driver 14 to the computer memory device 100 in a first order, but executed by the computer memory device 100 in a second order different from the first order), more than one command can have a "data transfer ready" status.

In certain embodiments, the storage device driver 14 can transmit multiple data transfer commands for which the transferred data for the commands are interleaved with one another prior to reading completion statuses of the commands. In certain other embodiments, the storage device driver 14 can transmit multiple data transfer commands for which the transferred data for the commands are transmitted sequential to one another prior to reading the completion statuses of the commands. The steps of the commands can be executed in sequence with one another per command (e.g., one command is completed before a subsequent command is begun), resulting in the slowest execution of commands. However, in certain other embodiments, execution of the steps of the commands can be interleaved with one another or can be combined with one another. For example, the reading of the "data transfer ready" status and the completion status can be combined into one status check. Upon reading the completion status for a command, the storage device driver 14 can also check whether other commands are "data transfer ready" and/or if any other previous commands are also completed, thereby avoiding the use of a separate status check.

In certain embodiments in which the computer memory device 100 is operatively coupled to a DIMM slot of the computer system 10, the PMI 110 can be configured to respond to commands from the storage device driver 14 of the CPU 12 in a manner that utilizes the DIMM slot protocol. The storage device driver 14 can indicate to the system memory controller 16 how to operate the computer memory device 100 plugged into the DIMM slot. For example, a DIMM slot protocol for operating a DDR-3 volatile memory module can comprise activating a ROW address (e.g., page) followed by a read or write command and a COLUMN address. The data transfer phase can then start with a data burst (e.g., eight words of eight bytes each, totaling 64 bytes). The data transfer phase can continue by the storage device driver 14 issuing more commands during the data transfer phase until the boundary of the ROW (e.g., page) is reached.

Various combinations of ROW addresses, COLUMN addresses, BANK addresses, and Commands can be used to define specific operations of the computer memory device 100 in accordance with certain embodiments described herein. For example, Table 1 defines one example having four types of operations of the computer memory device 100 that can be performed. While Table 1 refers to an example embodiment in which a COLUMN address is indicated by a number from 0 to 1023 (e.g., by 10 bits), certain other embodiments can utilize COLUMN addresses that are indicated by a number from 0 to 2047 (e.g., by 11 bits as used for certain DDR-x configurations) or by other numbers or numbers of bits. In addition, while the example read and write operations are described as using data bursts of 64 bytes, other sizes of data bursts are also compatible with certain embodiments described herein.

TABLE 1

| Type of operation | Command on DIMM slot | DIMM Address | | |
| --- | --- | --- | --- | --- |
| | | BANK | ROW | COLUMN |
| Commands (all) | WRITE | 0 | 0 | 0-1023 |
| Response | READ | 0 | 0 | 0-1023 |
| Write Data | WRITE | 1 | 0 | 0-1023 |
| Read Data | READ | 1 | 0 | 0-1023 |

For this example, a READ operation can be performed as follows:

The computer system 10 (e.g., the storage device driver 14) transmits an ACTIVATE command with BANK address of 0 and ROW address of 0 to the DIMM slot and the command is detected by the computer memory device 100.

The computer system 10 (e.g., the storage device driver 14) transmits a WRITE command with COLUMN address of x (e.g., where x is a number from 0 to 1023) to the DIMM slot and the command is detected by the computer memory device 100. The COLUMN address of x designates a location within the command queue.

The computer system 10 (e.g., the storage device driver 14) transmits a data burst (e.g., 64 bytes) to the DIMM slot. The data burst denotes an encoded data read command including a logical address corresponding to the data being requested to be read from the NVM 130. The computer memory device 100 receives the data burst and places the encoded data read command in the command queue at the location designated by x.

The computer memory device 100 decodes the command at location x of the command queue as a data read command and extracts the logical address of the data that is being requested.

The computer memory device 100 internally requests the data (e.g., including translating the logical address to a physical address to be read) and places the data read from the corresponding physical location of the NVM 130 in a read buffer of the read data path in preparation of transmitting the data to the computer system 10.

The computer memory device 100 prepares a Response word corresponding to the data read command that requested the data in the read buffer. For example, a "data transfer ready" or "RDY for Transfer" Response word (e.g., 64 bytes) can be prepared that identifies the location within the command queue of the command to which the "data transfer ready" Response word corresponds.

The computer system 10 (e.g., the storage device driver 14) can transmit a READ command and a COLUMN address of y (e.g., where y is a number from 0 to 1023) to the DIMM slot and the command is detected by the computer memory device 100. The COLUMN address y designates the location within the command queue of the command to which the status is queried.

The computer memory device 100 can update its command status circuit to note that this read command is ready (e.g., a "data transfer ready" Response word).

The computer system 10 (e.g., the storage device driver 14) detects the Response word indicating that the data corresponding to the data read command is ready for transfer from the computer memory device 100.

The computer system 10 (e.g., the storage device driver 14) transmits an ACTIVATE command with BANK address of 1 and ROW address of 0 to the DIMM slot and the command is detected by the computer memory device

100. Note that if the ROW and BANK had previously been opened, the ACTIVATE command may not be needed.

The computer system 10 (e.g., the storage device driver 14) transmits a READ command with a COLUMN address of z (e.g., where z is a number from 0 to 1023) to the DIMM slot and the command is detected by the computer memory device 100. The COLUMN address of z designates a location in the command queue of the data read command corresponding to the data to be transmitted.

The computer memory device 100 transmits the requested data from the read buffer (e.g., in one or more data bursts with a data burst comprising 64 bytes) to the computer system 10 (e.g., via the system memory controller bus 18). The data bursts can continue (e.g., by incrementing the COLUMN address to sequentially correspond to the multiple data bursts of 64 bytes each). If additional requested data is to be transmitted, the computer system 10 can transmit additional READ commands until the requested data is exhausted or a page boundary is reached. If the requested data is not completed when the page boundary is reached, the computer system 10 can transmit additional ACTIVATE commands and subsequent READ commands to get the computer memory device 100 to transmit additional data bursts. The computer memory device 100 can update its command status circuit to note that this read command is complete (e.g., a "read complete" Response word).

The computer system 10 (e.g., the storage device driver 14) transmits an ACTIVATE command with BANK address 0 and ROW address 0 to the DIMM slot and the command is detected by the computer memory device 100.

The computer system 10 (e.g., the storage device driver 14) transmits a READ command with COLUMN address of w (e.g., where w is a number from 0 to 1023) to the DIMM slot and the command is detected by the computer memory device 100. The COLUMN address of w designates a location in the command queue of the data read command for which status is being requested.

The computer system 10 (e.g., the storage device driver 14) detects the "read complete" Response word and informs the CPU 12 that the read operation is completed.

For this example, a WRITE operation can be performed as follows:

The computer system 10 (e.g., the storage device driver 14) transmits an ACTIVATE command with BANK address of 0 and ROW address of 0 to the DIMM slot and the command is detected by the computer memory device 100.

The computer system 10 (e.g., the storage device driver 14) transmits a WRITE command with COLUMN address of x (e.g., where x is a number from 0 to 1023) to the DIMM slot and the command is detected by the computer memory device 100. The COLUMN address of x designates a location within the command queue.

The computer system 10 (e.g., the storage device driver 14) transmits a data burst (e.g., 64 bytes) to the DIMM slot. The data burst denotes an encoded data write command including a logical address corresponding to the data to be written to the NVM 130. The computer memory device 100 receives the data burst and places the encoded data write command in the command queue at the location designated by x.

The computer memory device 100 decodes the command at location x of the command queue as a data write command and extracts the logical address of the physical locations to which the data is to be written.

The computer memory device 100 internally requests memory space of the NVM 130 at which the data is to be written (e.g., including translating the logical address to a physical address to which the data is to be written).

The computer memory device 100 prepares a Response word corresponding to the data write command. For example, a "data transfer ready" or "RDY for Transfer" Response word (e.g., 64 bytes) can be prepared that identifies the location within the command queue of the command to which the "data transfer ready" Response word corresponds.

The computer system 10 (e.g., the storage device driver 14) can transmit a READ command and a COLUMN address of y (e.g., where y is a number from 0 to 1023) to the DIMM slot and the command is detected by the computer memory device 100. The COLUMN address of y designates the location within the command queue of the command to which the status is queried.

The computer memory device 100 can update its command status circuit to note that this write command is ready (e.g., a "data transfer ready" Response word).

The computer system 10 (e.g., the storage device driver 14) detects the Response word indicating that the NVM space corresponding to the data write command is ready for transfer of the data from the computer system 10.

The computer system 10 (e.g., the storage device driver 14) transmits an ACTIVATE command with BANK address of 1 and ROW address of 0 to the DIMM slot and the command is detected by the computer memory device 100. Note that if the ROW and BANK had previously been opened, the ACTIVATE command may not be needed.

The computer system 10 (e.g., the storage device driver 14) transmits a WRITE command with a COLUMN address of z (e.g., where z is a number from 0 to 1023) to the DIMM slot and the command is detected by the computer memory device 100. The COLUMN address of z designates a location in the command queue of the data write command corresponding to the data to be written.

The computer system 10 (e.g., the storage device driver 14) transmits the data to be written to the computer memory device 100 (e.g., in one or more data bursts with a data burst comprising 64 bytes). The computer memory device 100 places the data in a write buffer. The data bursts can continue (e.g., by incrementing the COLUMN address to sequentially correspond to the multiple data bursts of 64 bytes each). If additional data is to be written, the computer system 10 can transmit additional WRITE commands until the data to be written is exhausted or a page boundary is reached. If the data to be written is not completed when the page boundary is reached, the computer system 10 can transmit additional ACTIVATE commands and subsequent WRITE commands to get the computer memory device 100 to write additional data bursts.

The computer memory device 100 can write the data from the write buffer to the NVM 130.

The computer system 10 (e.g., the storage device driver 14) transmits an ACTIVATE command with BANK address 0 and ROW address 0 to the DIMM slot and the command is detected by the computer memory device 100.

The computer system 10 (e.g., the storage device driver 14) transmits a READ command with COLUMN address of w (e.g., where w is a number from 0 to 1023) to the DIMM slot and the command is detected by the computer memory device 100. The COLUMN address of w designates a location in the command queue of the data write command for which status is being requested.

The computer memory device 100 can update its command status circuit to note that this write command is complete (e.g., a "write complete" Response word).

The computer system 10 (e.g., the storage device driver 14) detects the "write complete" Response word and informs the CPU 12 that the write operation is completed.

In the various examples of the computer memory device 100 described below, the computer memory device 100 comprises various components, circuitry, and features. While these components, circuitry, and features are described with regard to particular example configurations, people of ordinary skill in the art understand that the described components, circuitry, and features can be combined with one another, or with other components, circuitry, and features, in other combinations besides the specific combinations described in the particular example configurations and that a selected one or more of the described components, circuitry, and features can be omitted from other configurations which are still compatible with certain embodiments described herein. For instance, particular example configurations are described below in which the computer memory device 100 comprises one or more processors that are responsive to commands from the storage device driver 14 to control various components, circuitry, or features of the computer memory device 100. People skilled in the art understand that the functionality of these one or more processors can be combined together in a single processor or can be parsed differently among the one or more processors (e.g., into a different number of processors, organized among the one or more processors in different combinations).

Figure 5:
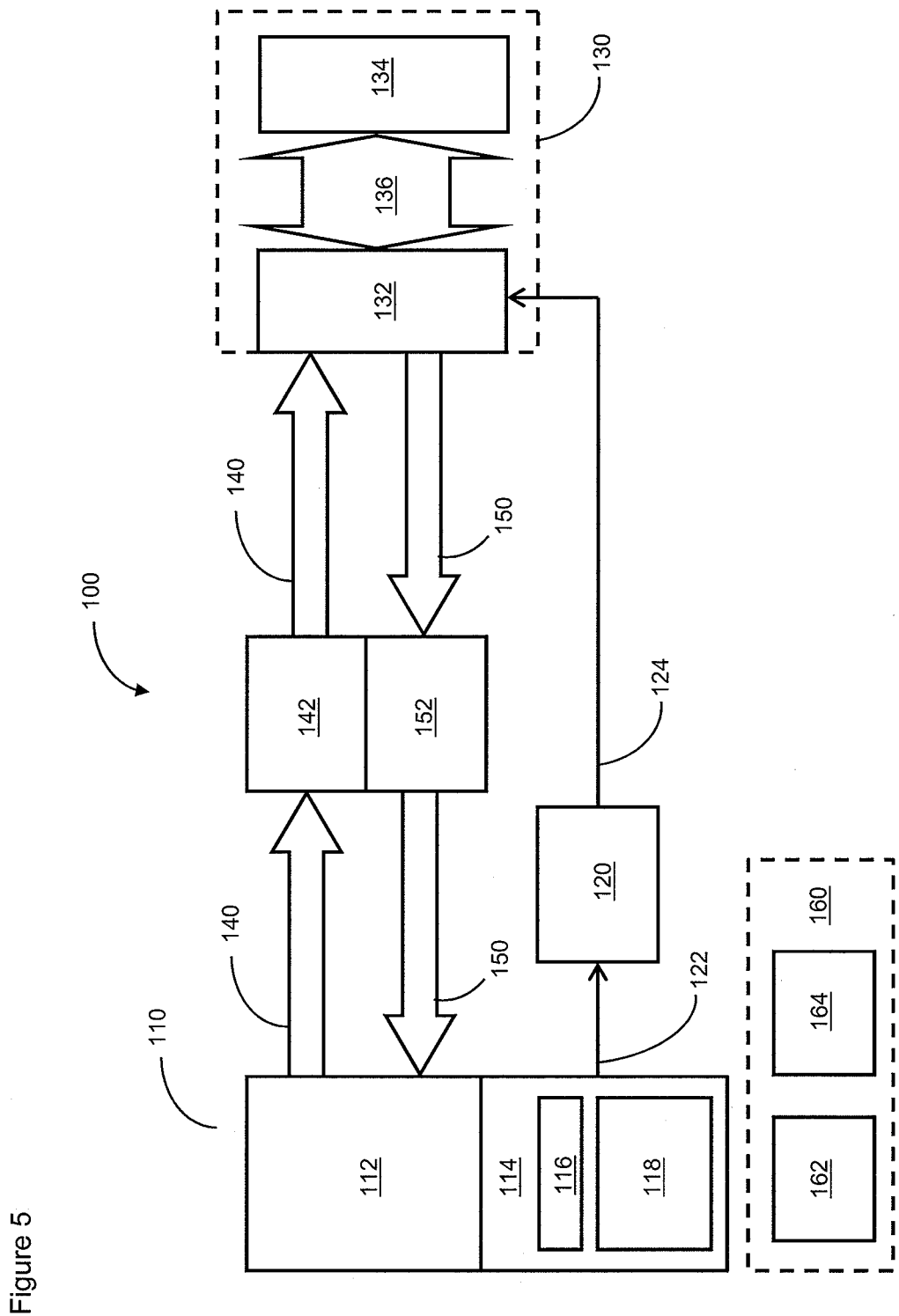
FIG. 5 schematically illustrates an example computer memory device in accordance with certain embodiments described herein.

FIG. 5 schematically illustrates an example computer memory device 100 in accordance with certain embodiments described herein. The parallel data portion 112 of the PMI 110 is configured to receive data in parallel from the computer system 10 and to transmit the received data in parallel to the NVM 130 via a write data path 140. The write data path 140 can comprise at least one write buffer 142 configured to facilitate proper data transfer from the PMI 110 to the NVM 130. The parallel data portion 112 of the PMI 110 is further configured to receive data in parallel from the NVM 130 via a read data path 150 and to transmit the received data in parallel to the memory control bus 18 of the computer system 10. The read data path 150 can comprise at least one read buffer 152 configured to facilitate proper data transfer from the NVM 130 to the PMI 110.

The command portion 114 of the PMI 110 is configured to receive commands comprising logical addresses from the system memory controller bus 18 of the computer system 10. In certain embodiments, the command portion 114 of the PMI 110 can comprise at least one command status circuit 116 and at least one command queue 118 configured to store the commands received by the command portion 114 of the PMI 110. The at least one command status circuit 116 is configured to maintain a record of the status of each of the active commands in the corresponding at least one command queue 118, and to facilitate the computer memory device 100 to perform the operations corresponding to the active commands in a proper order (e.g., by presenting status information regarding the commands in the at least one command queue 118 in a manner accessible to the computer system 10). For example, the command portion 114 can be configured to receive a series of commands from the system memory controller 16 in a first order, and the computer memory device 100 can be configured to execute the commands in a second order different from the first order (e.g., the second order can be based on relative priorities of the commands).

The ATC 120 is configured to receive logical addresses extracted from commands received by the command portion 114 of the PMI 110. For data received by the PMI 110 to be written to the NVM 130, the ATC 120 is configured to translate the received logical addresses 122 corresponding to the received data to physical addresses 124 of physical locations within the NVM 130 at which the received data is to be written. For data requested by the computer system 10 to be read from the NVM 130, the ATC 120 is configured to translate the received logical addresses 122 corresponding to the requested data to physical addresses 124 of physical locations within the NVM 130 at which the requested data requested by the computer system 10 can be read (e.g., physical locations at which the requested data was previously stored within the NVM 130).

The NVM 130 is configured to receive data from the PMI 110 via the write data path 140 and to provide data to the PMI 110 via the read data path 150. The NVM 130 is configured to receive from the ATC 120 the physical addresses 124 that correspond to the physical locations within the NVM 130 at which the received data from the PMI 110 is to be written and the physical locations within the NVM 130 from which the provided data is to be read. The data is transferred between the controller 132 of the NVM 130 and the array 134 of non-volatile memory locations of the NVM 130 via a parallel data bus 136 which comprises a plurality of channels (e.g., CH[n:0]).

The computer memory device 100 can comprise at least one processor 160 configured to respond to control signals from the storage device driver 14 and to provide appropriate control signals to the various other components of the computer memory device 100. In this way, the computer memory device 100 can be controlled by the storage device driver 14 which resides in the host CPU 12. For example, as shown in FIG. 5, the at least one processor 160 can comprise a first processor 162 (e.g., configured to control data transfer to and from the computer memory device 100 by providing control signals to the PMI 110, including the status register 116 and the command queue 118) and a second processor 164 (e.g., configured to control non-volatile memory management by providing control signals to the at least one write buffer 142, the at least one read buffer 152, and the controller 132 of the NVM 130). The first processor 162 and the second processor 164 can be configured to communicate with each other (e.g., using a task scheduler system, micro-operating system, custom firmware, or an off-the-shelf operating system) to control and schedule the various tasks to be performed to the various data blocks.

Figure 6:
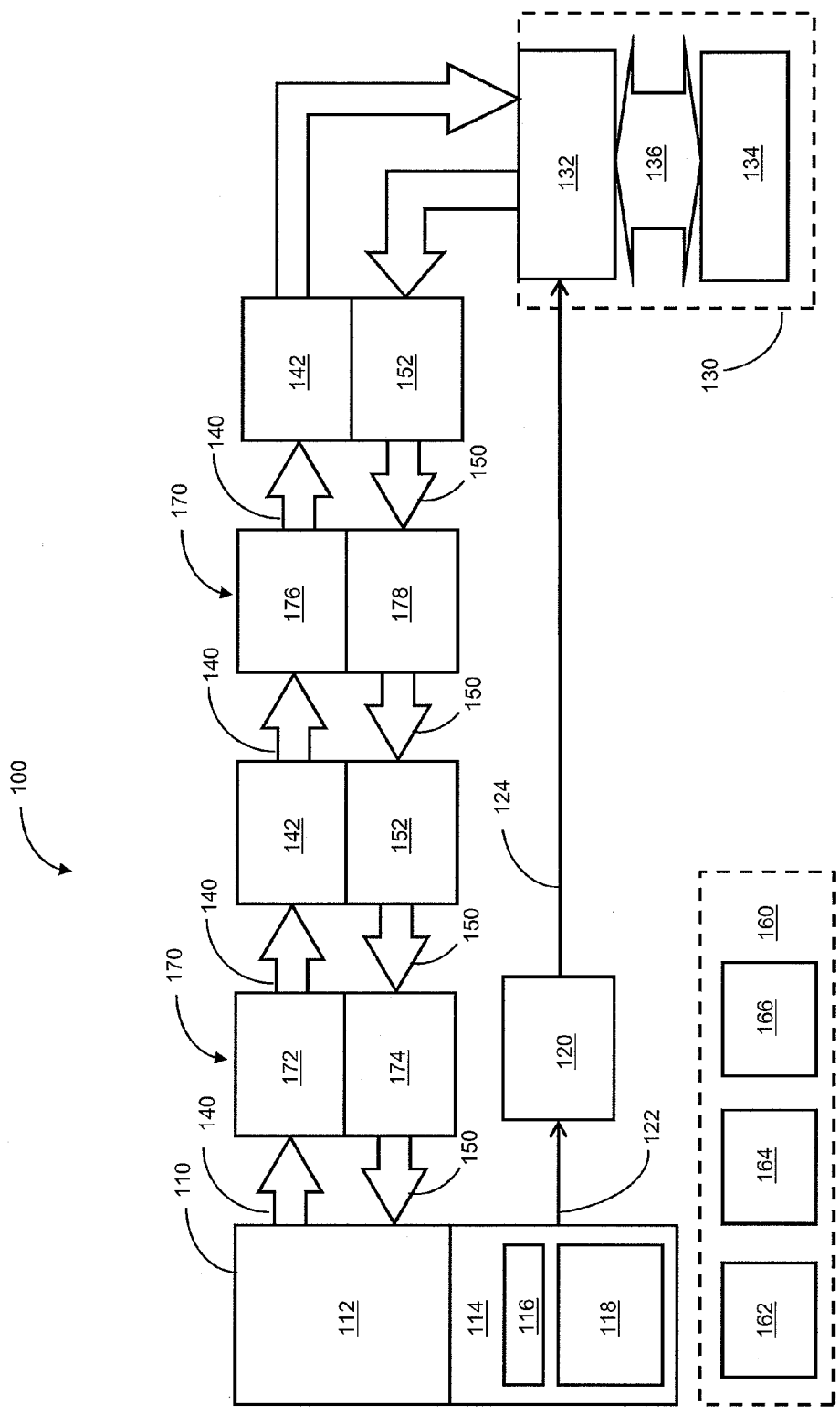
FIG. 6 schematically illustrates another example computer memory device in accordance with certain embodiments described herein.

FIG. 6 schematically illustrates another example computer memory device 100 in accordance with certain embodiments described herein. The example computer memory device 100 of FIG. 6 comprises the various components as described above with regard to FIG. 5, as well as other components of the write data path 140 and of the read data path 150. In particular, the example computer memory device 100 of FIG. 6 comprises one or more data processing circuits 170 configured to facilitate use of the data being transmitted between the computer system 10 and the NVM 130 of the computer memory device 100.

For example, the one or more data processing circuits 170 of the computer memory device 100 can provide a parallel cyclic redundancy check (CRC) capability for detection of errors in the data transmitted between the computer system 10 and the NVM 130 of the computer memory device 100. The parallel CRC capability can be provided by a CRC generation circuit 172 of the write data path 140 (e.g., between the PMI 110 and a write buffer 142; between the PMI 110 and the NVM 130) and a CRC check circuit 174 of the read data path 150 (e.g., between the PMI 110 and a read buffer 152; between the PMI 110 and the NVM 130). For each data block being transmitted along the write data path 140 to the NVM 130, the CRC generation circuit 172 can calculate a check value corresponding to the data in the data block (e.g., a CRC checksum) and to append the check value to the data block. For example, for a 16-bit CRC (CRC-16), the check value can be calculated using a polynomial of the form $(X^{16}+X^{12}+X^5+1)$. Other parallel CRC schemes can also be used in accordance with certain embodiments described herein.

The check value remains with the data block during subsequent transfers and operations within the computer memory device 100 (e.g., being written to the NVM 130). For each data block later read from the NVM 130 and transmitted along the read data path 150, the CRC check circuit 174 can compare the check value that was previously appended to the data block with a current value corresponding to the current data of the data block, and can remove the previously-appended check value from the data block. A discrepancy between the previously-appended check value and the current value corresponding to the current data of the data block is indicative of an error which occurred in the data block. In certain such embodiments, the computer memory device 100 can be configured to flag such errors for appropriate action by the computer system 10 (e.g., by the host CPU 12, the system memory controller 16, and/or the computer memory device 100).

The one or more data processing circuits 170 can further provide other capabilities for facilitating the use (e.g., security, quality) of the data transmitted between the computer system 10 and the NVM 130 of the computer memory device 100. For example, the other data processing capability can comprise one or more of the following: data scrambling/descrambling, data compression/decompression, and other data error detection and correction. The one or more data processing circuits 170 of the computer memory device 100 can comprise at least one first data processing circuit 176 of the write path 140 (e.g., between two write buffers 142; between the PMI 110 and the NVM 130) and at least one second data processing circuit 178 of the read data path (e.g., between two read buffers 152; between the NVM 130 and the PMI 110). The at least one first data processing circuit 176 can receive data from one write buffer 142 and can transmit processed data to another write buffer 142 along (e.g., "downstream") the write data path 140. The at least one second data processing circuit 178 can receive data from one read buffer 152 and can transmit processed data (e.g., processed to reverse the process of the at least one first data processing circuit 176) to another read buffer 152 along (e.g., "downstream") the read data path 150.

For data security, the at least one first data processing circuit 176 can comprise a data scrambler circuit that is configured to apply a predetermined scrambling operation to the data blocks to be written to the NVM 130 and the at least one second data processing circuit 178 can comprise a data descrambler circuit that is configured to apply a predetermined descrambling operation, complementary to the scrambling operation of the data scrambler circuit, to the data blocks read from the NVM 130. Various algorithms may be used to perform both security (e.g., encoding) and scrambling of incoming data, along with security (e.g., decoding) and descrambling of outgoing data, in accordance with certain embodiments described herein (e.g., an AES 128-bit, or 192- bit, or 256-bit engine). Other algorithms for scrambling and descrambling can be used in accordance with certain embodiments described herein (e.g., ARC4) to cypher and decipher incoming and outgoing data. For data compression, the at least one first data processing circuit 176 can comprise a data compression circuit that is configured to apply a predetermined compression operation to the data blocks to be written to the NVM 130 and the at least one second data processing circuit 178 can comprise a data decompression circuit that is configured to apply a predetermined decompression operation, complementary to the compression operation of the data compression circuit, to the data blocks read from the NVM 130. Various algorithms may be used to perform both compression of incoming data and decompression of outgoing data in accordance with certain embodiments described herein (e.g., LZRW3 lossless based on Lempel-Ziv (LZ) compression method algorithm). For error correction, the at least one first data processing circuit 176 can comprise a error check generation circuit that is configured to calculate error check values for the data blocks to be written to the NVM 130 and the at least one second data processing circuit 178 can comprise a error check comparison circuit that is configured to compare a previously-calculated error check value with a current error check value for the data blocks read from the NVM 130 to detect errors that occurred between writing the data block to the NVM 130 and reading the data block from the NVM 130. Examples of error correction schemes that may be utilized by the data processing circuits 176, 178 include but are not limited to: Reed-Solomon encoder and decoder error detection and correction, low-density parity check (LDPC) encoder and decoder error detection and correction, BCH (Bose, Chaudhuri) algorithms, and Viterbi algorithms. For example, error correction code can be applied to data being stored at the memory locations of the NVM 130 (e.g., data being transmitted along the write data path 140) and error correction can be applied to data subsequently read from the memory locations of the NVM 130 (e.g., data being transmitted along the read data path 150).

After having traversed the various components of the write data path 140, the data can be written by the controller 132 to the array 134 of non-volatile memory locations (via the parallel data bus 136 comprising the plurality of channels) at a physical location that corresponds to the physical address 124 provided by the ATC 120. In addition, the data requested by the computer system 10 can be read from the NVM 130 at a physical location corresponding to the physical address 124 provided by the ATC 120 and transmitted to the PMI 110 via the various components of the read data path 150. The NVM 130 is configured to receive from the ATC 120 the physical addresses 124 corresponding to the physical locations within the NVM 130 from which the provided data is to be read. The data is transferred between the controller 132 of the NVM 130 and the array 134 of non-volatile memory locations of the NVM 130 via a parallel data bus 136 which comprises a plurality of channels (e.g., CH[n:0]).

In addition to the first processor 162 and the second processor 164 of the at least one processor 160, as described above with regard to FIG. 5, the at least one processor 160 of FIG. 6 can further comprise a third processor 166. The third processor 166 can be configured to respond to control signals from the storage device driver 14 and to provide appropriate control signals at appropriate times to various components of the computer memory device 100 (e.g., configured to control data processing by providing control signals to the at least one first data processing circuit 176 and the at least one second data processing circuit 178). The first processor 162, the second processor 164, and the third processor 166 can be configured to communicate with each other (e.g., using a task scheduler system, micro-operating system, custom firmware, or an off-the-shelf operating system) to control and schedule the various tasks to be performed to the various data blocks.

Figure 7A:
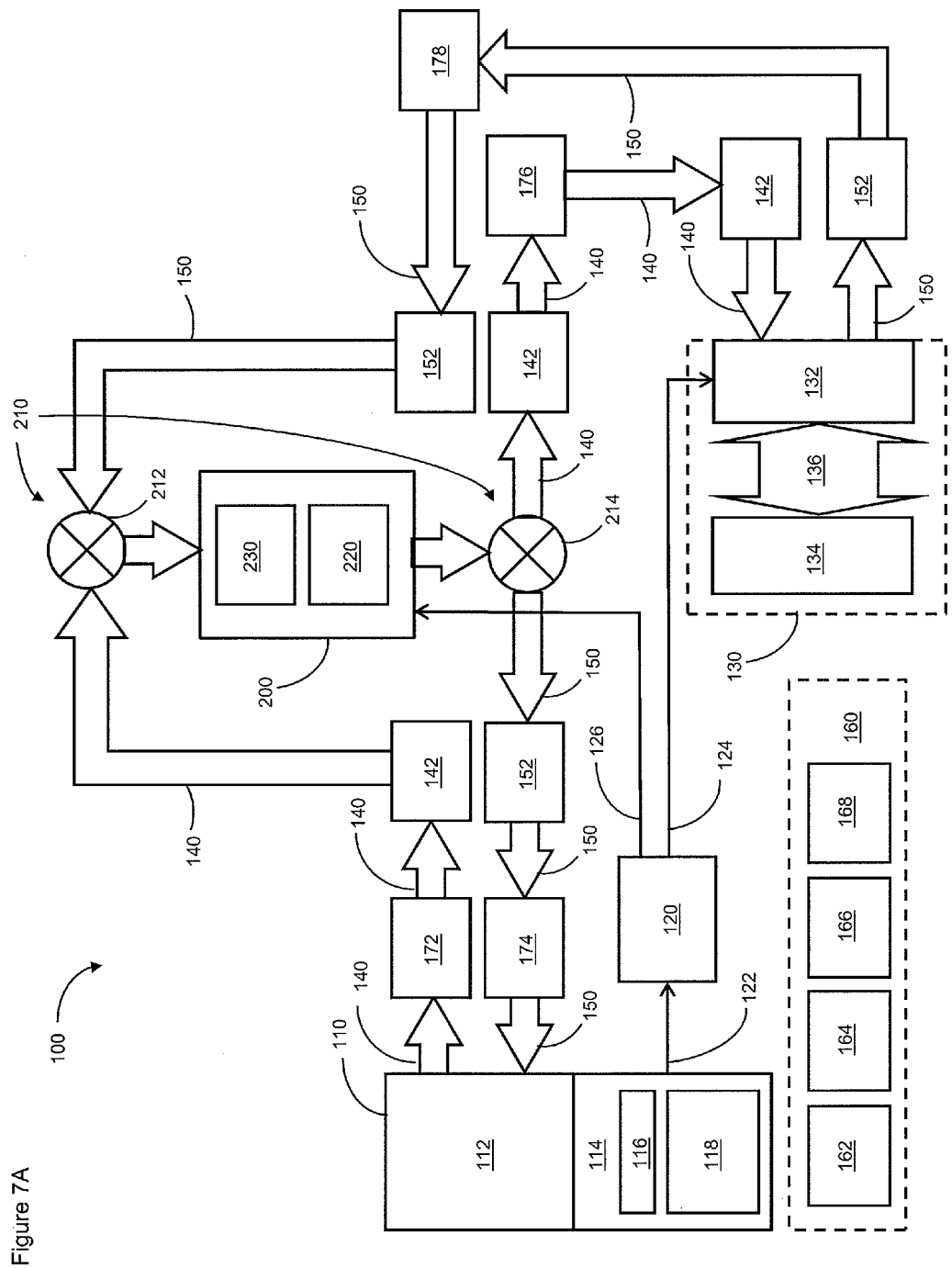
FIG. 7A schematically illustrates another example computer memory device in accordance with certain embodiments described herein.

FIG. 7A schematically illustrates another example computer memory device 100 in accordance with certain embodiments described herein. The example computer memory device 100 of FIG. 7A comprises the various components as described above with regard to FIGS. 5 and 6, as well as a volatile cache memory 200 and various other components to facilitate data transfer between the NVM 130 and the volatile cache memory 200. Data transfer to and from volatile memory can be much faster than data transfer to and from non-volatile memory (e.g., by an order of magnitude). Certain such embodiments advantageously use the volatile cache memory 200 as a data repository for a portion of data stored in the NVM 130, from which the data can be accessed faster than if the computer memory device 100 only included the NVM 130 (e.g., staging the data).

The computer memory device 100 of certain embodiments can comprise at least one data path selection circuit 210. As schematically illustrated in FIG. 7A, the at least one data path selection circuit 210 can comprise a multiplexer 212 configured to selectively transfer data being transmitted from the PMI 110 along the write data path 140 to the volatile cache memory 200 and to selectively transfer data being transmitted from the NVM 130 along the read data path 150 to the volatile cache memory 200. The at least one data path selection circuit 210 can further comprise a demultiplexer 214 configured to transfer data from the volatile cache memory 200 to be transmitted either along the write data path 140 to the NVM 130 or along the read data path 150 to the PMI 110. In certain embodiments, the multiplexer 212 and the demultiplexer 214 are configured to be operated independently of one another. Certain such embodiments can advantageously provide flexibility of the data path option to be used such that the PMI 110 can write to the volatile cache memory 200 while the volatile cache memory 200 transfers data to the NVM 130, to provide flexibility of the data path option to be used such that the volatile cache memory 200 can send data to the PMI 110 while the NVM 130 transfers data to the volatile cache memory 200, or both.

The volatile memory 200 can comprise a volatile memory controller 220 and an array 230 of volatile memory locations operatively coupled to the volatile memory controller 220. The volatile memory controller 220 can be operatively coupled to the ATC 120, which is configured to generate internal volatile memory addresses 126 corresponding to the logical addresses received by the PMI 110. For data provided by the computer system 10 in conjunction with a write command received by the PMI 110, the volatile memory controller 220 is further configured to receive the data from the multiplexer 212 and write the data to a physical location within the array 230 corresponding to the internal volatile memory address 126 received from the ATC 120 in conjunction with the write command. For data requested by the computer system 10 in conjunction with a read command received by the PMI 110, the volatile memory controller 220 is further configured to read the requested data from a physical location within the array 230 corresponding to the internal volatile memory address 126 received from the ATC 120 in conjunction with the read command and to transmit the requested data from the volatile memory 200 to the demultiplexer 214.

In addition to the processors 162, 164, 166 of the at least one processor 160, as described above with regard to FIG. 6, the at least one processor 160 of FIG. 7A can further comprise a fourth processor 168. The processors 162, 164, 166, 168 can be configured to respond to control signals from the storage device driver 14 and to provide appropriate control signals at appropriate times to control the various components of the computer memory device 100. For example, the first processor 162 can be configured to control the PMI 110, including the status register 116 and the command queue 118, as well as the CRC generation circuit 172 and the CRC check circuit 174, at least one write buffer 142 (e.g., the write buffer 142 immediately after the CRC generation circuit 172), and the ATC 120. The second processor 164 can be configured to control the volatile cache memory 200, including the volatile memory controller 220, at least one read buffer 152 (e.g., the read buffer 152 immediately before the CRC check circuit 174 and the read buffer 152 immediately before the multiplexer 212). The third processor 166 can be configured to control at least one write buffer 142 (e.g., the write buffer 142 immediately following the demultiplexer 214 and the write buffer 142 immediately before the NVM 130), the at least one first data processing circuit 176, and the at least one second data processing circuit 178. The fourth processor 168 can be configured to control at least one read buffer 152 (e.g., the read buffer 152 immediately after the NVM 130) and the NVM 130, including the non-volatile controller 132 (e.g., to perform non-volatile memory management). The processors 162, 164, 166, 168 can be configured to communicate with each other (e.g., using a task scheduler system, micro-operating system, custom firmware, or an off-the-shelf operating system) to control and schedule the various tasks to be performed to the various data blocks.

Figure 7B:
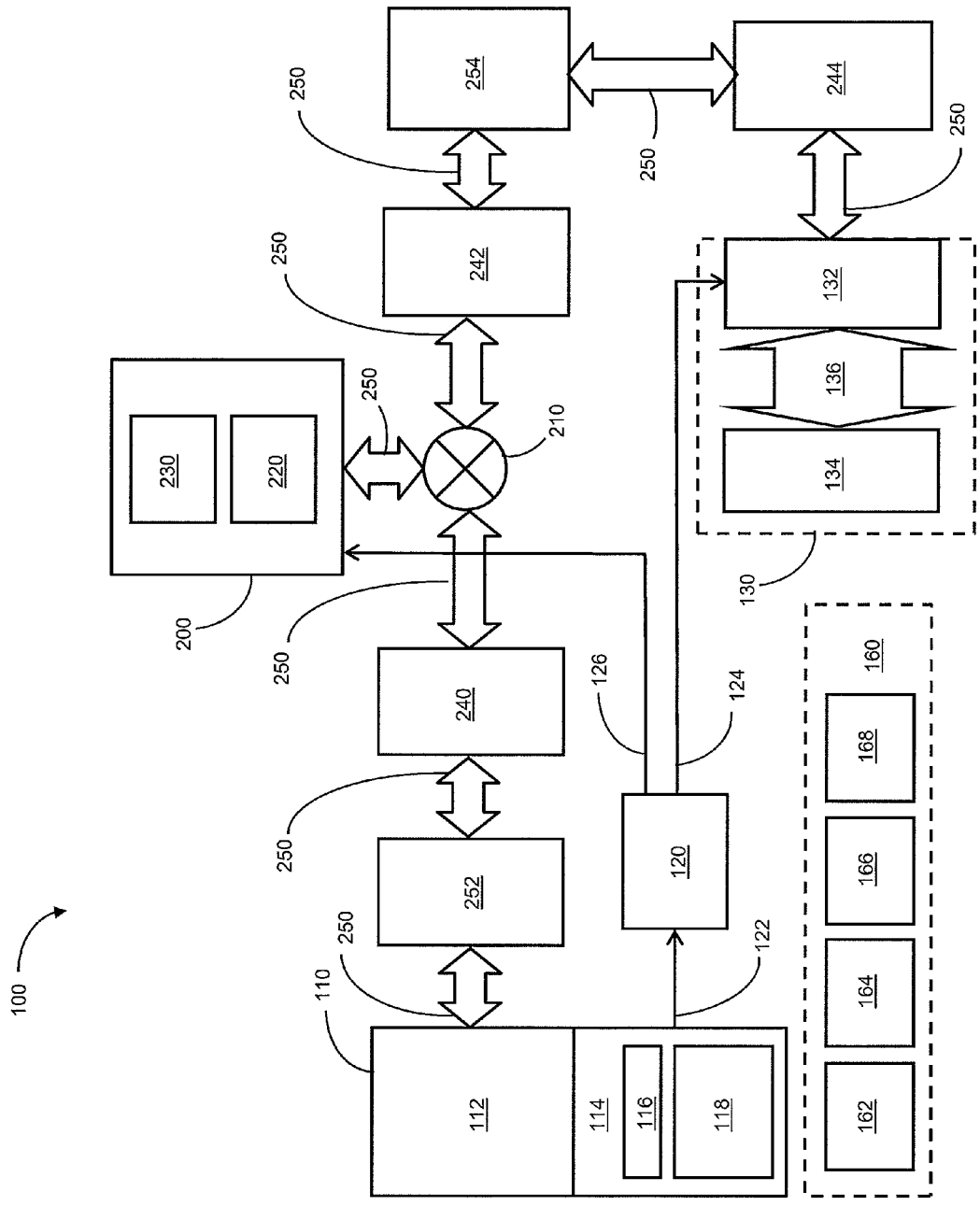
FIG. 7B schematically illustrates another example computer memory device in accordance with certain embodiments described herein.

FIG. 7B schematically illustrates another example computer memory device 100 in accordance with certain embodiments described herein. The example computer memory device 100 of FIG. 7B is similar to that of FIG. 7A, comprising the various components as described above with regard to FIGS. 5 and 6, as well as a volatile cache memory 200 and various other components to facilitate data transfer between the NVM 130 and the volatile cache memory 200. While FIG. 7A shows the write data path 140 and the read data path 150 separate from one another, FIG. 7B shows a bi-directional data path 250. In addition, while FIG. 7A has the at least one write buffer 142 and the at least one read buffer 152 separate from one another and the at least one data processing circuits 170 with separate components along the write and read data paths, FIG. 7B shows at least one data buffer (e.g., a first data buffer 240, a second data buffer 242, and a third data buffer 244) and at least one data processing circuit 170 (e.g., a first CRC data processing circuit 252 and a second data processing circuit 254 for data scrambling, compression, and error correction) that are in the bi-directional data path 250. Furthermore, the at least one data path selection circuit 210 can comprise a multiplexer/demultiplexer (mux/demux) configured to selectively transfer data being transmitted from the PMI 110 to the volatile cache memory 200, to selectively transfer data from the volatile cache memory 200 to be written to the NVM 130, to selectively transfer data read from the NVM 130 to the volatile cache memory 200, and to selectively transfer data from the volatile cache memory 200 to be transmitted to the PMI 110.

As shown in FIG. 7B, the at least one data path selection circuit 210 is configured to selectively transfer (i) data blocks received by the PMI 110 via the first data processing circuit 252 and the first data buffer 240 to the volatile memory 200 to be stored; (ii) data blocks retrieved from the NVM 130 via the third data buffer 244, the second data processing circuit 254, and the second data buffer 242 to the volatile memory 200 to be stored; (iii) data blocks retrieved from the volatile memory 200 to be provided to the computer system 10 via the first data buffer 240 and the first data processing circuit 252; and (iv) data blocks retrieved from the volatile memory 200 to be stored on the NVM 130 via the second data buffer 242, the second data processing circuit 254, and the third data buffer 244. In certain embodiments, the at least one data path selection circuit 210 is controlled by the at least one processor 160 (e.g., by a finite state machine).

In certain embodiments, the computer memory device 100 can be configured to facilitate virtualization, redundancy, and/or fault tolerance. For example, to facilitate virtualization, the computer memory device 100 can support multiple virtual servers and their parameters. The status register 116, the command queue 118, and the ATC 120 can each comprise multiple portions, each portion corresponding to a different virtual system, and the storage device driver 14 can be copied to all the virtual servers and the computer memory device 100 can have a command queue 118 and responses for each virtual server. Each of the multiple status register 116 portions and multiple command queue 118 portions can be used to keep track of commands and data transfers corresponding to the different virtual systems, and each of the multiple ATC 120 portions can generate physical addresses that correspond to portions of the NVM 130 that correspond to the different virtual systems. In certain other embodiments, the computer memory device 100 can comprise a single status register 116, a single command queue 118, and a single ATC 120 each configured to parse out the commands, data transfers, and physical addresses to correspond to different virtual systems. For another example, to facilitate fault tolerance, data in a failing portion of the NVM 130 can be reconstructed in other portions of the NVM 130 or in other NVMs 130 (for computer memory devices 100 comprising multiple NVMs 130). An off-line non-volatile memory array 134 can be used to replace a failing non-volatile memory array 134 by the controller 132, and data can be moved from the failing non-volatile memory array 134 and placed in a different non-volatile memory array 134.

As one example, the redundancy can be implemented by having multiple computer memory devices 100 in a computer system with one storage device driver 14 to address redundancy across the multiple computer memory devices 100 (e.g., analogous in a manner to RAID systems). As another example, the redundancy can be implemented by having one computer memory device 100 with one PMI 100 and multiple NVMs 130. In such examples, the storage device driver 14 can send user data into the computer memory device 100, and the computer memory device 100 can replicate the data or create redundancy across the multiple NVMs 130. In this example, only one NVM 130 can be active at any given time. In certain embodiments, the stripping of user data can be addressed by having each NVM 130 of the computer memory device 100 available. Once an active first NVM 130 fails (or exhibits a fault), the computer memory device 100 can activate a second NVM 130 and can switch the activity to the second NVM 130 along with transferring existing data from the first NVM 130 to the second NVM 130.

Some or all of the components of the computer memory device 100 (e.g., the PMI 110, 112, 114, 116, 118, the ATC 120, the NVM 130, the data buffers 142, 152, the one or more processors 160, 162, 164, 166, 168, the data processing circuits 170, 172, 174, 176, 178, the volatile memory 200, 220, 230, and the at least one data path selection circuit 210, 212, 214 can be manifested in one or more of the following: a field programmable gate array (FPGA), a complex programmable logic device (CPLD), an application specific integrated circuit (ASIC), an application specific standard part (ASSP), or a system-on-a-chip (SOC) device. Some or all of the one or more processors 160, 162, 164, 166, 168 can communicate with one another using one or more of the following: a scheduler, customized firmware, micro operating system (uOS), and off-the-shelf operating system (OS). Some or all of the one or more processors 160, 162, 164, 166, 168 can include a finite state machine.

Figure 8:
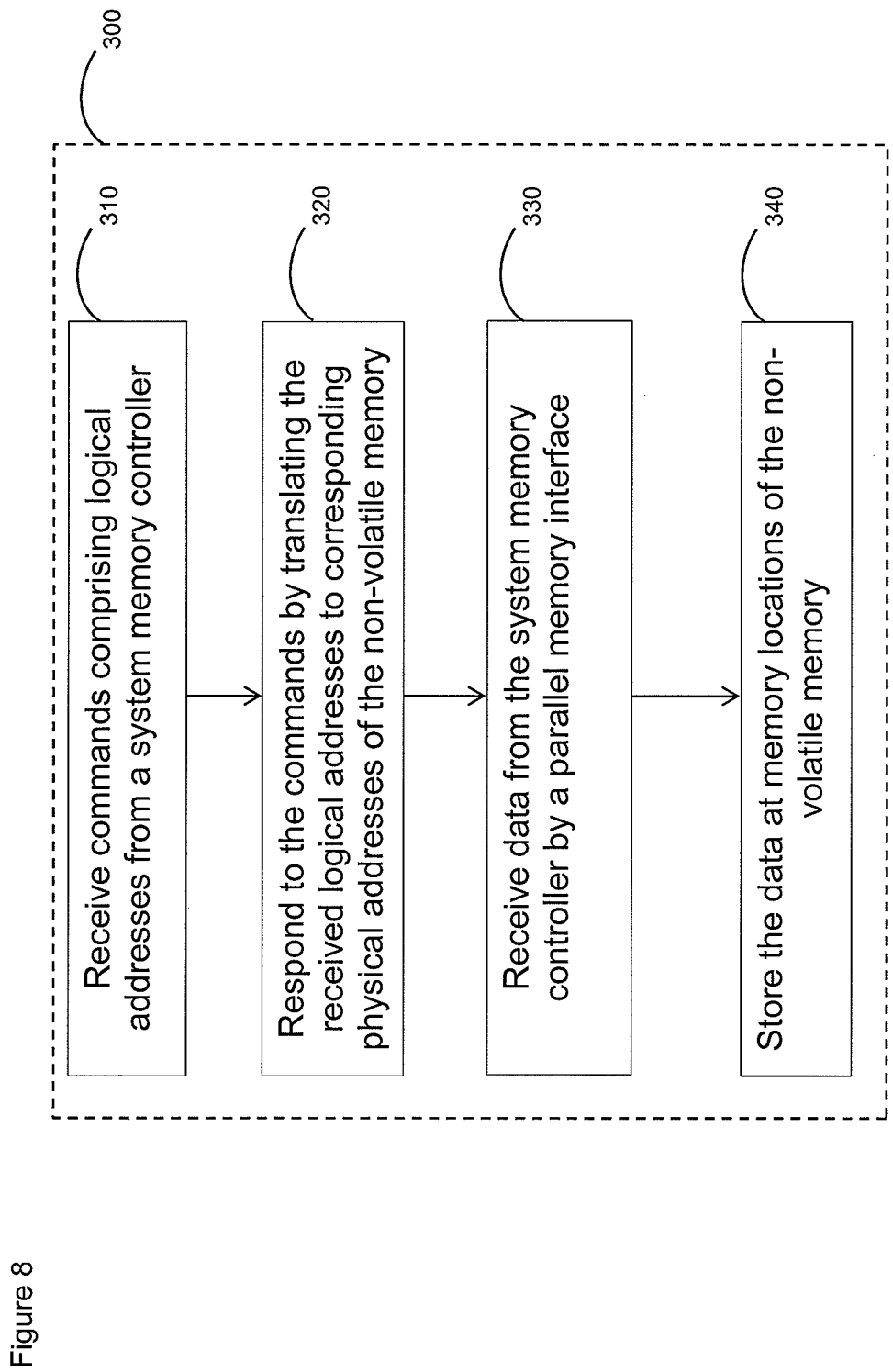
FIG. 8 is a flow diagram of an example method of storing data in accordance with certain embodiments described herein.

FIG. 8 is a flow diagram of an example method 300 of storing data in accordance with certain embodiments described herein. In an operational block 310, the method 300 comprises receiving commands from a system memory controller 16 of a computer system 10. The commands comprise logical addresses and are received by a computer memory device 100 comprising a parallel memory interface (PMI) 110 operatively coupled to the system memory controller 16 and operatively coupled to an non-volatile memory 130. In an operational block 320, the method 300 further comprises responding to the commands by translating the received logical addresses to corresponding physical addresses of the non-volatile memory 130. In an operational block 330, the method 300 further comprises receiving data from the system memory controller 16 by the PMI 110. In an operational block 340, the method 300 further comprises storing the data at memory locations of the non-volatile memory 130 corresponding to the physical addresses. In certain embodiments, in which the PMI 110 comprises a command status circuit and a command queue, the method 300 further comprises updating the command status circuit to reflect data transfer readiness by the PMI 110 and updating the command status circuit to reflect data transfer completion by the PMI 110.

Certain embodiments described herein advantageously provide improved latency and bandwidth as compared to previous systems that included non-volatile memory. While latency is dependent on the particular device characteristics (e.g., chipsets) and performance of the computer system 10 itself such that latency estimates are difficult to provide, certain embodiments described herein are configured to provide latencies that are between two and ten times shorter than latencies of conventional systems. Table 2 provides some example symbol rate and bandwidth values for various conventional serial interfaces as compared to values for certain embodiments described herein which utilize a PMI 110 as described herein.

TABLE 2

| Interface Technology | Symbol rate | Bandwidth |
|---|---|---|
| SATA (serial) | 1.5 Gb/s | 150 MB/s |
| SATA-2 (serial) | 3.0 Gb/s | 300 MB/s |
| SATA-3 (serial) | 6.0 Gb/s | 600 MB/s |
| SAS (serial) | 3.0 Gb/s | 300 MB/s |
| SAS-2 (serial) | 6.0 Gb/s | 600 MB/s |
| PCIe (serial) | 2.5 GT/s | 1000 MB/s (×4) |
| PCIe-2 (serial) | 5.0 GT/s | 2000 MB/s (×4) |
| PCIe-3 (serial) | 8.0 GT/s | 4000 MB/s (×4) |
| PMI 110 (parallel) | 1.6 GT/s | 12800 MB/s |
| | 1.866 GT/s | 14928 MB/s |
| | 2.133 GT/s | 17064 MB/s |

This comparison table shows advantages of certain embodiments described herein.

Embodiments have been described in connection with the accompanying drawings. However, it should be understood that the figures are not drawn to scale and are merely illustrative without representing actual dimensions or layout. In addition, the foregoing embodiments have been described at a level of detail to allow one of ordinary skill in the art to make and use the devices, systems, etc. described herein. As such, a wide variety of variation is possible and components, elements, and/or steps can be altered, added, removed, or rearranged. While certain embodiments have been explicitly described, other embodiments will become apparent to those of ordinary skill in the art based on this disclosure.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without user input or prompting, whether these features, elements and/or states are included or are to be performed in any particular embodiment.

Depending on the embodiment, certain acts, events, or functions of any of the methods described herein can be performed in a different sequence, can be added, merged, or left out completely (e.g., not all described acts or events are necessary for the practice of the method). Moreover, in certain embodiments, acts or events can be performed concurrently, e.g., through multi-threaded processing, interrupt processing, or multiple processors or processor cores, rather than sequentially.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The blocks of the methods and algorithms described in connection with the embodiments disclosed herein can be embodied directly in hardware, in a software module executed by a processor, or in a combination of the two. A software module can reside in RAM memory, non-volatile memory, flash memory, ROM memory, EPROM memory, EEPROM memory, registers, a hard disk, a removable disk, a CD-ROM, or any other form of computer-readable storage medium known in the art. An exemplary storage medium is coupled to a processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A computer memory device configured to be operatively coupled to a computer system comprising a computer processing unit having a storage device driver and a system memory controller operatively coupled to the computer processing unit, the computer memory device comprising:
    a parallel memory interface configured to be operatively coupled to the system memory controller, to receive data and commands comprising logical addresses from the system memory controller, and to transmit data to the system memory controller, the parallel memory interface configured to respond to the commands from the storage device driver of the computer processing unit;
    an address translation circuit configured to receive the logical addresses from the parallel memory interface and to translate the received logical addresses to corresponding physical addresses; and
    a non-volatile memory operatively coupled to the parallel memory interface and the address translation circuit, the non-volatile memory configured to receive the physical addresses and the data and to store the data at memory locations of the non-volatile memory corresponding to the physical addresses.

2. The computer memory device of claim 1, wherein the parallel memory interface comprises a command status circuit and a command queue and is configured to receive a series of commands from the system memory controller in a first order, wherein the computer memory device is configured to execute the commands in a second order different from the first order.

3. The computer memory device of claim 2, wherein the second order is based on relative priorities of the commands.

4. The computer memory device of claim 1, wherein the non-volatile memory comprises a controller and an array of non-volatile memory locations operatively coupled to the controller.

5. The computer memory device of claim 4, wherein the non-volatile memory comprises a fault-tolerant solid-state device and is configured to provide redundancy for data stored by the non-volatile memory.

6. The computer memory device of claim 1, further comprising a write data path from the parallel memory interface to the non-volatile memory and a read data path from the non-volatile memory to the parallel memory interface.

7. The computer memory device of claim 6, wherein the write data path comprises at least one write buffer and the read data path comprises at least one read buffer.

8. The computer memory device of claim 6, further comprising at least one data processing circuit operable to apply error correction code to data transmitted along the write data path and to apply error correction to data transmitted along the read data path.

9. The computer memory device of claim 6, further comprising at least one data processing circuit operable to apply compression to data transmitted along the write data path and to apply de-compression to data transmitted along the read data path.

10. The computer memory device of claim 6, further comprising at least one data processing circuit operable to apply security measures to data transmitted along the write data path and to apply security measures to data transmitted along the read data path.

11. The computer memory device of claim 6, further comprising at least one cyclic redundancy check circuit operable to append cyclic redundancy check values to data transmitted along the write data path and to evaluate cyclic redundancy check values appended to data transmitted along the read data path.

12. The computer memory device of claim 1, further comprising a cache memory comprising a controller and a plurality of volatile memory locations operatively coupled to the controller.

13. The computer memory device of claim 12, further comprising a data path selector configured to selectively transmit data from the parallel memory interface to the cache memory and to selectively transmit data from the non-volatile memory to the cache memory.

14. The computer memory device of claim 13, wherein the data path selector is further configured to selectively transmit data read from the cache memory to the parallel memory interface and to selectively transmit data read from the cache memory to the non-volatile memory.

15. The computer memory device of claim 14, wherein the data path selector comprises:
 a multiplexer configured to selectively transmit data from the parallel memory interface to the cache memory and to selectively transmit data from the non-volatile memory to the cache memory; and
 a demultiplexer configured to selectively transmit data read from the cache memory to the parallel memory interface and to selectively transmit data read from the cache memory to the non-volatile memory.

16. The computer memory device of claim 15, wherein the multiplexer and demultiplexer are configured to operate independently of one another.

17. A method of storing data, the method comprising:
 providing a computer memory device configured to be operatively coupled to a computer system comprising a computer processing unit having a storage device driver and a system memory controller operatively coupled to the computer processing unit, the computer memory device comprising:
  a parallel memory interface configured to be operatively coupled to the system controller, to receive data and commands comprising logical addresses from the system memory controller, and to transmit data to the system memory controller, the parallel memory interface configured to respond to the commands from the storage device driver of the computer processing unit;
  an address translation circuit configured to receive the logical addresses from the parallel memory interface and to translate the received logical addresses to corresponding physical addresses; and
  a non-volatile memory operatively coupled to the parallel memory interface and the address translation circuit the non-volatile memo configured to receive the physical addresses and the data and to store the data at memory locations of the non-volatile memory corresponding to the physical addresses;
 receiving the commands from the system memory controller of the computer system;
 responding to the commands by translating the received logical addresses to the corresponding physical addresses of the non-volatile memory;
 receiving the data from the system memory controller by the parallel memory interface;
 and
 storing the data at the memory locations of the non-volatile memory corresponding to the physical addresses.

18. The method of claim 17, further comprising receiving a series of commands from the system memory controller in a first order and executing the commands in a second order different from the first order.

19. The method of claim 18, wherein the second order is based on relative priorities of the commands.

20. The method of claim 18, wherein the non-volatile memory comprises a controller and an array of non-volatile memory locations operatively coupled to the controller.

21. The method of claim 18, further comprising applying error correction code to data being stored at the memory locations of the non-volatile memory and applying error correction to data subsequently read from the memory locations of the non-volatile memory.

22. The method of claim 18, further comprising applying compression to the data stored at the memory locations of the non-volatile memory and applying de-compression to data subsequently read from the memory locations of the non-volatile memory.

23. The method of claim 18, further comprising applying security measures to the data stored at the memory locations of the non-volatile memory and applying security measures to data subsequently read from the memory locations of the non-volatile memory.

24. The method of claim 18, further comprising appending cyclic redundancy check values to data stored at the memory locations of the non-volatile memory, evaluating the cyclic redundancy check values appended to data subsequently read from the memory locations of the non-volatile memory, and removing the cyclic redundancy check values from data being transmitted to the computer system.

25. The method of claim 18, further comprising storing at least a portion of the data in a cache memory comprising a controller and a plurality of volatile memory locations operatively coupled to the controller.

26. The method of claim 25, further comprising selectively transmitting received data to the cache memory and selectively transmitting data from the non-volatile memory to the cache memory.

27. The method of claim 26, further comprising selectively transmitting data read from the cache memory to the computer system and selectively transmitting data read from the cache memory to the non-volatile memory.

28. The method of claim 17, wherein the parallel memory interface comprises a command status circuit and a command queue, the method further comprising updating the command status circuit to reflect data transfer readiness by the parallel memory interface and updating the command status circuit to reflect data transfer completion by the parallel memory interface.

* * * * *